(12) United States Patent
Toda

(10) Patent No.: US 6,182,234 B1
(45) Date of Patent: Jan. 30, 2001

(54) CLOCK CONTROL CIRCUIT

(75) Inventor: Haruki Toda, Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/166,635

(22) Filed: Oct. 5, 1998

(30) Foreign Application Priority Data

Oct. 6, 1997 (JP) .................................................. 9-272790

(51) Int. Cl.[7] .................................................. G06F 1/04
(52) U.S. Cl. .................................................. 713/501; 713/503
(58) Field of Search .................................................. 713/400, 401, 713/500, 501, 503, 600

(56) References Cited

U.S. PATENT DOCUMENTS

| | | | |
|---|---|---|---|
| 5,294,842 | * | 3/1994 | Iknaian et al. ........................ 327/144 |
| 5,309,035 | * | 5/1994 | Watson, Jr. et al. ................. 327/141 |
| 5,745,533 | * | 4/1998 | Asada et al. ........................... 375/354 |
| 5,867,432 | * | 2/1999 | Toda ....................................... 365/194 |
| 5,867,693 | * | 2/1999 | Wang et al. ........................... 713/500 |

FOREIGN PATENT DOCUMENTS 7262076    10/1995    (JP) .............................. G06F/12/00

* cited by examiner

*Primary Examiner*—Dennis M. Butler
(74) *Attorney, Agent, or Firm*—Hogan & Hartson, LLP

(57) ABSTRACT

An internal clock pulse CKH is inputted via a delay circuit to the forward delay section FD of a synchronous adjustable delay circuit. An internal clock CK' is inputted as a control clock pulse to the synchronous adjustable delay circuit. The forward delay section FD of the synchronous adjustable delay circuit includes delay stages and delays a pulse FCL' for a time of $\Delta$ equivalent to the time elapsed until the internal clock pulse CK' in the next cycle rises. The backward delay section HBD of the synchronous adjustable delay circuit including delay stages delays the internal clock CK' for a delay equivalent to a time of $\Delta/2$. The output HCLQ of the backward delay section HBD is outputted as an internal clock pulse CKQ via another delay circuit.

15 Claims, 6 Drawing Sheets

| | CKA | CKB | CKC |
|---|---|---|---|
| n=1 | CK0 | CK0 | $CK\frac{1}{2}$ |
| n=2 | $CK\frac{1}{2}$ | CK0 | $CK\frac{1}{4}$ ($CK\frac{1}{2^2}$) |
| | CK0 | $CK\frac{1}{2}$ | $CK\frac{3}{4}$ ($CK\frac{3}{2^2}$) |
| n=1 | $CK\frac{3}{4}$ ($CK\frac{3}{2^2}$) | CK0 | $CK\frac{1}{8}$ ($CK\frac{1}{2^3}$) |
| | CK0 | $CK\frac{1}{4}$ ($CK\frac{1}{2^2}$) | $CK\frac{3}{8}$ ($CK\frac{3}{2^3}$) |
| | $CK\frac{1}{4}$ ($CK\frac{1}{2^2}$) | $CK\frac{1}{2}$ ($CK\frac{2}{2^2}$) | $CK\frac{5}{8}$ ($CK\frac{5}{2^3}$) |
| | $CK\frac{1}{2}$ ($CK\frac{2}{2^2}$) | $CK\frac{3}{4}$ ($CK\frac{3}{2^2}$) | $CK\frac{7}{8}$ ($CK\frac{7}{2^3}$) |

CLOCK CONTROL CIRCUIT

BACKGROUND OF THE INVENTION

This invention relates to a clock control circuit which generates various internal clocks that have specific phase relationships with an external clock.

In semiconductor systems, including a synchronous DRAM (SDRAM), to fetch the data read from a memory surely outside the memory, it is necessary to set a time interval called a data window and output the data within the data window. To set such a data window, it is necessary to generate an internal clock having a specific phase relationship with an external clock. To achieve this, a clock control circuit is used.

A conventional clock control circuit, however, has the problem that it does not operate properly when the cycle time of an external clock is short.

BRIEF SUMMARY OF THE INVENTION

An object of the present invention is to provide a clock control circuit which operates properly even when the cycle time of an external clock is short.

Another object of the present invention is to provide a semiconductor memory device which is capable of setting a data window properly even when the cycle time of an external clock is short and fetching the data read from a memory surely outside the memory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
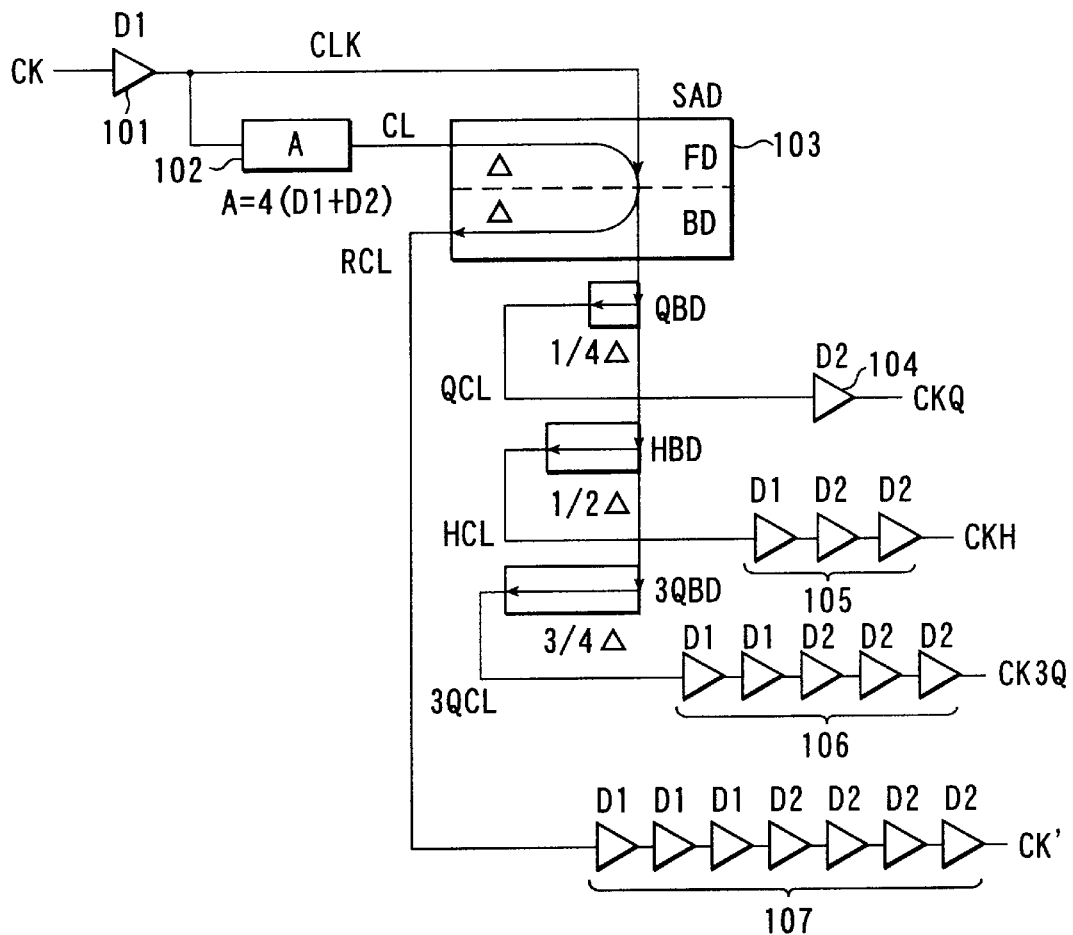
FIG. 1 is a circuit diagram of a clock control circuit.

Hereinafter, referring to the drawings, embodiments of the present invention will be explained.

In U.S. patent application Ser. No. 08/839037, the inventor of this application has disclosed a circuit for generating internal clock pulses having specific phase relationships with an external clock pulse. FIG. 1 shows the configuration of a clock control circuit disclosed in FIG. 38 of the application of the U.S. patent application Ser. No. 08/839037.

The clock control circuit generates an internal clock pulse CKQ 90° (T/4) out of phase with an external clock pulse CK having a period of T, an internal clock pulse CKH 180° (T/2) out of phase with the external clock pulse CK, an internal clock pulse CK3Q 270° (3T/4) out of phase with the external clock pulse CK, and an internal clock pulse CK' 360° (T) out of phase with the external clock pulse CK, or in phase with CK.

Specifically, in the clock control circuit, the external clock pulse CK is inputted to an input buffer 101 using as a receiver with a delay of D1. The input buffer 101 outputs an internal clock pulse CLK with a skew of D1 to the external clock pulse CK. The internal clock CLK is inputted not only to a delay circuit 102 with a delay of A but also to a synchronous adjustable delay (SAD) circuit 103. The output pulse CL from the delay circuit 102 is inputted to a forward delay section FD of the synchronous adjustable delay circuit 103. The synchronous adjustable delay circuit 103 includes a backward delay section BD in addition to the forward delay section FD.

Each of the forward and backward delay sections FD and BD of the synchronous adjustable delay circuit 103 comprises delay circuits arranged in a number of stages. An input pulse supplied to each delay section is delayed by these delay circuits. Detailed configuration of the forward and backward delay sections FD and BD will be described later.

The pulse CL inputted to the forward delay section FD is delayed for a time of Δ at the forward delay section FD until an internal clock pulse CLK in the next cycle rises. The internal clock pulse CLK in the next cycle is inputted to the backward delay section BD and 1/4 backward delay section QBD (Quarter Backward Delay), 1/2 backward delay section HBD (Half Backward Delay), and 3/4 backward delay section 3QBD (3 Quarter Backward Delay), which delay the clock pulse CLK for specific times respectively.

The backward delay section BD in the synchronous adjustable delay circuit 103 has as many delay stages as achieve a delay time of Δ equal to that of the forward delay section FD and delays the internal clock pulse CLK for Δ. The 1/4 backward delay section QBD has as many delay stages as achieve a delay time of Δ/4 equivalent to 1/4 of the delay time Δ of the forward delay section FD; the 1/2 backward delay section HBD has as many delay stages as achieve a delay time of Δ/2 equivalent to 1/2 of the delay time Δ; and the 3/4 backward delay section 3QBD has as many delay stages as achieve a delay time of 3Δ/4 equivalent to 3/4 of the delay time Δ. The 1/4, 1/2 and 3/4 backward delay sections QBD, HBD, and 3QBD delay the internal clock pulse CLK for Δ/4, Δ/2, and 3Δ/4, respectively.

The delayed pulse QCL from the 1/4 backward delay section QBD passes through a delay circuit 104 using as a driver with a delay of D2 and becomes an internal clock pulse CKQ.

The delayed pulse HCL from the 1/2 backward delay section HBD passes through a delay circuit 105 using as a driver with a delay of (D1+D2×2) and becomes an internal clock pulse CKH.

The delayed pulse 3QCL from the 3/4 backward delay section 3QBD passes through a delay circuit 106 using as a driver with a delay of (D1×2+D2×3) and becomes an internal clock pulse CK3Q.

The delayed pulse RCL from the backward delay section BD passes through a delay circuit 107 using as a driver with a delay of (D1×3+D2×4) and becomes an internal clock pulse CK'.

If a delay of A in the delay circuit 102 is set at 4(D1+D2), the period T of the external clock CK will be T=4(D1+D2)+Δ. This is because the period of the external clock CK is equal to that of the internal clock CLK and that one period of the internal clock CLK corresponds to the length of time during which the internal clock CLK passes through the delay circuit 102 and is delayed by the forward delay section FD by time Δ.

The delay time of the internal clock pulse CKQ from the external clock pulse CK will be D1+Δ/4+D2=(D1+D2)+Δ/4. Thus, the internal clock pulse CKQ will be 90° (T/4) out of phase with the external clock CK.

The delay time of the internal clock pulse CKH from the external clock pulse CK will be D1+Δ/2+D1+D2×2=2(D1+D2)+Δ/2. Thus, the internal clock pulse CKH will be 180° (T/2) out of phase with the external clock CK.

The delay time of the internal clock pulse CK3Q from the external clock pulse CK will be D1+3Δ/4+D1×2+D2×3=3(D1+D2)+3Δ/4. Thus, the internal clock pulse CK3Q will be 270° (3T/4) out of phase with the external clock CK.

The delay time of the external clock pulse CK' from the internal clock pulse CK will be D1+Δ+D1×3+D2×4=4(D1+D2)+Δ. Thus, the internal clock pulse CK' will be in phase with the external clock CK (or 360° (the period T) out of phase with the external clock CK).

In the clock control circuit of FIG. 1, because the delay A of the delay circuit 102 is 4(D1+D2), the lower limit of the operable cycle time of the clock control circuit is restricted greatly. In other words, the upper limit of the frequency range that ensures a stable operation of the clock control circuit is restricted.

Specifically, for the synchronous adjustable delay circuit 103 to operate stably, the delay A must be smaller than the cycle time of the external clock pulse CK. The reason is that the synchronous adjustable delay circuit 103 adjusts the delay Δ in the remaining part of the cycle time.

For example, in a case where the frequency of the external clock CK is 125 MHz and the cycle time is 8 ns, the delay equivalent to (D1+D2) must be 2 ns or less. In actuality, however, the sum of the delay D1 of the input buffer (which is used as a receiver of the external clock CK) and the delay D2 (which corresponds to the driver delay of the internal clock) cannot be easily set at 2 ns or less since there are a number of restrictions on the realization of this. For example, a buffer must be made of an element of extremely large size.

Figure 2A:
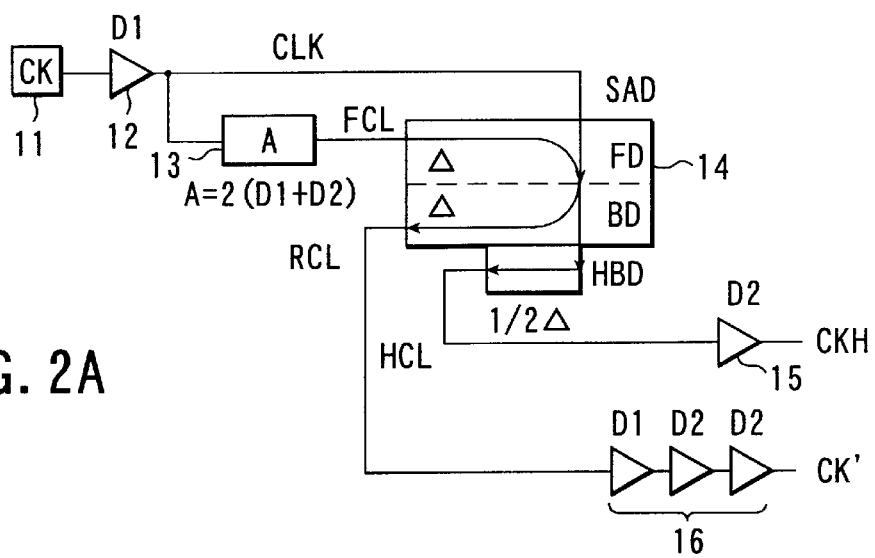
FIGS. 2A to 2C are circuit diagrams of a clock control circuit according to a first embodiment of the present invention.
Figure 2B:
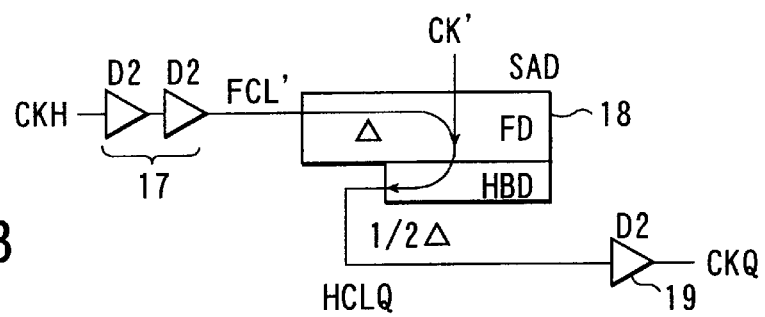
Figure 2C:
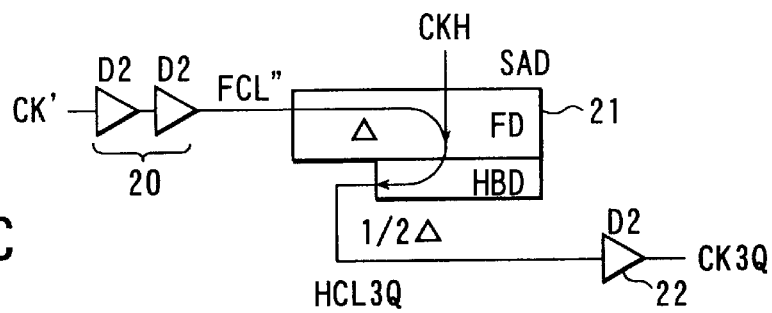

FIGS. 2A to 2C are diagrams of a clock control circuit according to a first embodiment of the present invention.

The circuit of FIG. 2A generates from an external clock pulse CK with a specific period of T an internal clock pulse CKH 180° (a period of T/2) out of phase with the external clock pulse CK and an internal clock CK' 360° (a period of T) out of phase with the external clock pulse CK, or in phase with the external clock pulse CK.

The circuit of FIG. 2B receives the internal clock pulse CKH from the circuit of FIG. 2A as an input clock pulse and the internal clock pulse CK' as a control clock pulse and generates from these two clock pulses an internal clock pulse CKQ 90° (a period of T/4) out of phase with the external clock pulse CK (or the internal clock CK').

The circuit of FIG. 2C receives the internal clock pulse CK' from the circuit of FIG. 2A as an input clock pulse and the internal clock pulse CKH as a control clock pulse and generates from these two clock pulses an internal clock pulse CKQ 270° (a period of 3T/4) out of phase with the external clock pulse CK (or the internal clock CK').

In the circuit of FIG. 2A, the external clock pulse CK with the specific period T from an input terminal 11 is inputted to an input buffer 12 using as a receiver with a delay of D1. The input buffer 12 outputs an internal clock pulse CLK with a skew (delay) of D1 to the external clock pulse CK. The internal clock pulse CLK is inputted not only to the delay circuit 13 with a delay of A but also to the synchronous adjustable delay (SAD) circuit 14 as a control clock pulse. The delay A of the delay circuit 13 is set at 2(D1+D2).

The output pulse FCL from the delay circuit 13 is inputted to the forward delay circuit FD of the synchronous adjustable circuit 14. The synchronous adjustable circuit 14 includes a backward delay section BD and a 1/2 backward delay section HBD in addition to the forward delay section FD.

The forward delay section FD is provided with delay stages. The input pulse FCL is delayed, passing through the delay stages. In the synchronous adjustable circuit 14, a pulse FCL is inputted to the forward delay section FD. The delay time Δ of the pulse FCL until the internal clock pulse CLK in the next cycle rises is measured according to how many delay stages the pulse FCL has passed through. The delay equivalent to the delay time Δ of the measured pulse FCL and the delay equivalent to half the delay time Δ/2 are stored in state hold circuits in high or low form.

The internal clock pulse CLK is supplied to the backward delay section BD and 1/2 backward delay section HBD. Both the backward delay sections BD and HBD delay the internal clock pulse CLK for a delay equivalent to the delay time Δ and the delay time Δ/2 stored in the state hold circuits, respectively.

The output HCL of the 1/2 backward delay section HBD is inputted to the delay circuit 15. The delay section 15 is composed of a driver having a delay of D2. Then, the output of the delay circuit 15 is supplied to the circuit of each of FIGS. 2B and 2C.

The output RCL of the backward delay section BD is inputted to the delay circuit 16. The delay circuit 16 functions as a driver for an internal clock pulse and is composed of a driver with a delay of D1 and two drivers each with a delay of D2 connected in series. The output of the delay circuit 16 is supplied as the internal clock pulse CK' to the circuit of each of FIGS. 2B and 2C.

In the circuit of FIG. 2B, the internal clock CHK generated at the circuit of FIG. 2A is inputted to the delay circuit

17. The delay circuit 17 is composed of two drivers each with a delay of D2 connected in series and outputs an internal clock pulse FCL' with a delay of 2·D2 to the internal clock pulse CKH. The internal clock pulse FCL' is inputted to the forward delay section FD of the synchronous adjustable delay circuit (SAD) 18. The internal clock pulse CK' generated at the circuit of FIG. 2A is inputted as a control clock pulse to the synchronous adjustable delay circuit 18. The synchronous adjustable delay circuit 18 includes a 1/2 backward delay section HBD in addition to the forward delay section FD.

The forward delay section FD of the synchronous adjustable delay section 18 also includes delay stages. The inputted pulse FCL' passes through the delay stages and is delayed. In the synchronous adjustable delay circuit 18, the pulse FCL' is inputted to the forward delay section FD and the delay time $\Delta$ of the pulse FCL' elapsed until the internal clock pulse CK' in the next cycle rises is measured according to how many delay stages the pulse FCL' has passed. A delay equivalent to the time $\Delta/2$ half the delay time $\Delta$ of the measured pulse FCL' is stored in state hold circuits in high or low form.

The internal clock pulse CK' is supplied to the 1/2 backward delay section HBD. The 1/2 backward delay section HBD delays the internal clock pulse CK' for a delay equivalent to the delay time $\Delta/2$ stored in the state hold circuits. The output HCLQ of the 1/2 backward delay section HBD is inputted to the delay circuit 19 composed of a driver with a delay of D2. Then, the output of the delay circuit 19 makes an internal clock CKQ.

In the circuit of FIG. 2C, the internal clock CK' generated at the circuit of FIG. 2A is inputted to the delay circuit 20. The delay circuit 20 is composed of two drivers each with a delay of D2 connected in cascade and outputs an internal clock pulse FCL" with a delay of 2·D2 to the internal clock pulse CK'. The internal clock pulse FCL" is inputted to the forward delay section FD of the synchronous adjustable delay circuit (SAD) 21. The internal clock pulse CKH generated at the circuit of FIG. 2A is inputted as a control clock pulse to the synchronous adjustable delay circuit 21. The synchronous adjustable delay circuit 21 includes a 1/2 backward delay section HBD in addition to the forward delay section FD.

The forward delay section FD of the synchronous adjustable delay section 21 also includes delay stages. The inputted pulse FCL" passes through the delay stages and is delayed. In the synchronous adjustable delay circuit 21, the pulse FCL" is inputted to the forward delay section FD and the delay time $\Delta$ of the pulse FCL" elapsed until the internal clock pulse CKH in the next cycle rises is measured according to how many delay stages the pulse FCL" has passed. A delay equivalent to the time $\Delta/2$ half the delay time $\Delta$ of the measured pulse FCL" is stored in state hold circuits in high or low form.

The internal clock pulse CKH is supplied to the 1/2 backward delay section HBD. The 1/2 backward delay section HBD delays the internal clock pulse CKH for a delay equivalent to the delay time $\Delta/2$ stored in the state hold circuits. The output HCL3Q of the 1/2 backward delay section HBD is inputted to the delay circuit 22 composed of a driver with a delay of D2. Then, the output of the delay circuit 22 makes an internal clock CK3Q.

Figure 3:
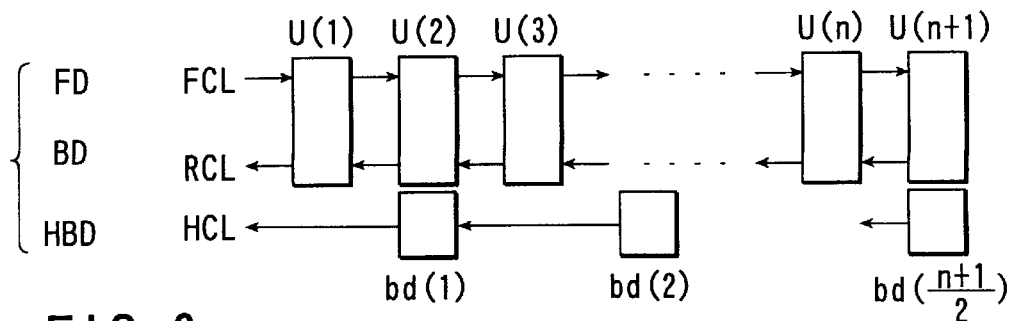
FIG. 3 is a block diagram of a synchronous adjustable delay circuit in one of FIGS. 2A to 2C.

FIG. 3 is a block diagram of the synchronous adjustable delay circuit 14 of FIG. 2A.

In FIG. 3, U(1) to U(n+1) (n is a positive integer) indicate delay units constituting the forward delay section FD and the backward delay section BD. These (n+1) delay units are connected in a multistage manner. Moreover, bd(1), bd(2), . . . bd((n+1)/2) indicate delay units constituting the 1/2 backward delay section HBD. These (n+1)/2 delay units are connected in a multistage manner.

Figure 4:
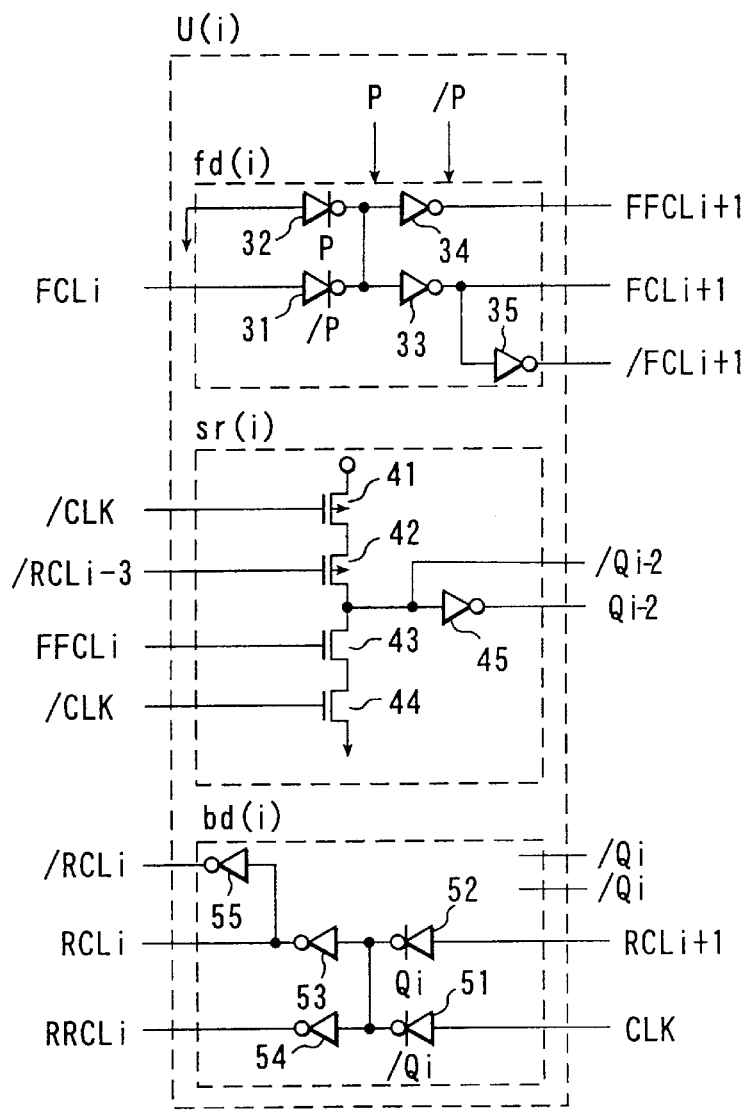
FIG. 4 is a concrete circuit diagram of a delay unit in FIG. 3.

FIG. 4 shows a concrete configuration of one delay unit U(I) (i=1 to n+1) of the (n+1) delay units in FIG. 3.

As shown in FIG. 4, the delay unit U(i) is composed of a pulse delay circuit fd(i) constituting a single stage of the forward delay section FD, a state hold circuit sr(i), and a pulse delay circuit bd(i) constituting a single stage of the backward delay section BD.

The pulse delay circuit fd(i) is composed of two clocked inverters 31, 32 and three inverters 33, 34, 35.

The clock pulse FCLi outputted from the pulse delay circuit fd(i−1) at the preceding stage is inputted to the input terminal of the clocked inverter 31. The clocked inverter 31 is activated when a control pulse /P created from the internal clock pulse CLK is high. When being activated, the clocked inverter 31 inverts the clock pulse FCLi.

The input terminal of the clocked inverter 32 is connected to the ground potential. The low level is constantly inputted to the input terminal. The clocked inverter 32 is activated when the control pulse P which is complementary to the control pulse /P is high. When being activated, the clocked inverter 32 inverts the low-level input.

The output terminals of the clocked inverters 31, 32 are connected to each other at a common node. To the common node, the input terminals of the inverters 33, 34 are connected. The output of the inverter 33 is supplied to the delay unit U(i+1) at the following stage as clock pulse FCLi+1. Furthermore, the output of the inverter 33 is inverted by the inverter 35. The inverted output is supplied as clock pulse /FCLi+1. The output of the inverter 34 is supplied as clock pulse FFCLi+1.

The state hold circuit sr(i) is composed of two p-channel MOS transistors 41, 42, two n-channel transistors 43, 44, and an inverter 45.

The source-to-drain path of the two p-channel MOS transistors 41, 42 is connected in series between a node of power supply voltage and the input terminal of the inverter 45. An internal clock pulse /CLK which is complementary to the internal clock pulse CLK is supplied to the gate electrode of one p-channel MOS transistor 41. A clock pulse /RCLi−3 generated at the pulse delay circuit bd(i−3) in the delay unit U(i−3) three stages ahead of the present stage is supplied to the gate electrode of the other p-channel MOS transistor 42.

The source-to-drain path of the two n-channel MOS transistors 43, 44 is connected in series between the input terminal of the inverter 45 and the ground node. A clock pulse FFCLi generated at the pulse delay circuit fd(i−1) at the preceding stage is supplied to the gate of one n-channel MOS transistor 43. The internal clock pulse /CLK is supplied to the gate electrode of the other n-channel MOS transistor 44.

The signal at the input terminal of the inverter 45 is supplied as a state hold signal /Qi−2 to a delay unit at a subsequent stage and the output signal of the inverter 45 is supplied as a state hold signal Qi−2 to a delay unit at a subsequent stage.

The pulse delay circuit bd(i) is composed of two clocked inverters 51, 52 and three inverters 53, 54, 55.

The internal clock pulse CLK is supplied to the input terminal of the clocked inverter 51. The clocked inverter 51 is activated when the state hold signal /Qi generated at the state hold circuit sr(i+2) is high. When being activated, the clocked inverter 51 inverts the clock pulse CLK.

The clock pulse RCLi+1 generated at the pulse delay circuit bd(i+1) is supplied to the input terminal of the clocked inverter 52. The clocked inverter 52 is activated when the state hold signal Qi which is complementary to the state hold signal /Qi is high. When being activated, the clocked inverter 52 inverts the clock pulse RCLi+1.

The output terminals of the clocked inverters 51, 52 are connected to each other at a common node. To the common node, the input terminals of the inverters 53, 54 are connected. The output of the inverter 53 is supplied as clock pulse FCLi. Furthermore, the output of the inverter 53 is inverted by the inverter 54. The inverted output is supplied as clock pulse /RCLi. The output of the inverter 54 is also supplied as clock pulse RPCLi.

The operation of the delay unit U(i) of FIG. 4 will be explained briefly. In the pulse delay circuit fd(i), the clocked inverter 31 is activated when the control pulse /P is high, which allows the clock pulse FCLi from the preceding stage to pass through the clocked inverter 31 and inverter 33 and be outputted to the following stage. Therefore, the delay time for one stage of the pulse delay circuit fd(i) is the sum of the gate delay times of the clocked inverter 31 and inverter 33.

Because the clocked inverter 31 is inactivated when the control pulse P is high (/P=low), the clock pulse FCLi from the preceding stage is not transferred to the next stage. Instead, the clocked inverter 32 is activated, fixing both the clock pulses FFCLi+1, FCLi+1 at the low level.

In the state hold circuit sr(i), if the clock pulse FFCLi from the preceding stage is high when the internal clock pulse /CLK is high, the state hold signal Qi-2 will be high and /Qi-2 will be low. If the clock pulse /RCLi-3 from the preceding stage is low when the internal clock pulse /CLK is low, the state hold signal Qi-2 will be low and /Qi-2 will be high.

In the pulse delay circuit bd(i), when the state control signal /Qi is high, the clocked inverter 51 is activated, selecting the internal clock pulse CLK. That is, the delay of the internal clock pulse CLK starts at the delay unit U(i). Then, the internal clock pulse CLK passes through the clocked inverter 51 and inverter 53 and is delayed for one stage of the delay circuit. The delayed clock pulse is outputted as clock pulse RCLi to the preceding stage. In this case, the delay time equivalent to one stage of the pulse delay circuit bd(i) is the sum of the gate delay times of the clocked inverter 51 and inverter 53 as that of the pulse delay circuit bd(i).

Because the clocked inverter 51 is inactivated when the state control signal Qi is high (/Qi=low), the internal clock pulse CLK from the delay unit U(i) is not delayed. Instead, the clocked inverter 52 is activated, selecting the clock pulse RCLi+1 from the following state. The clock pulse RCLi+1 passes through the clocked inverter 52 and inverter 53 and is delayed for one stage of the delay circuit. The delayed clock pulse is outputted as clock pulse RCLi to the preceding stage. At that time, the clock pulses RRCLi, /RCLi are outputted from the inverters 54, 55, respectively.

Figure 5:
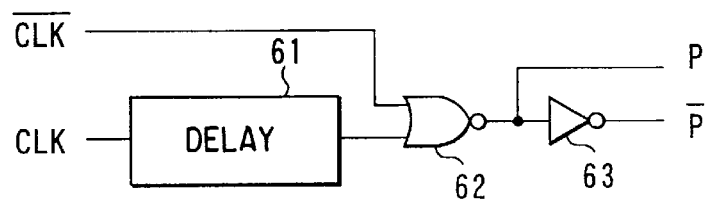
FIG. 5 is a detailed circuit diagram of a control pulse generator circuit for generating control pulses used in the circuit of FIG. 4.

FIG. 5 shows a detailed configuration of a control pulse generator circuit that generates control pulses P, /P used in the circuit of FIG. 4. In FIG. 5, the internal clock pulse CLK is supplied via a delay circuit 61 to one input terminal of a NOR gate 62. The internal clock pulse /CLK is supplied to the other input terminal of the NOR gate 62. The output of the NOR gate 62 is the control pulse P. The output of an inverter 63 that inverts the output of the NOR gate 62 is the control pulse /P.

Figure 6:
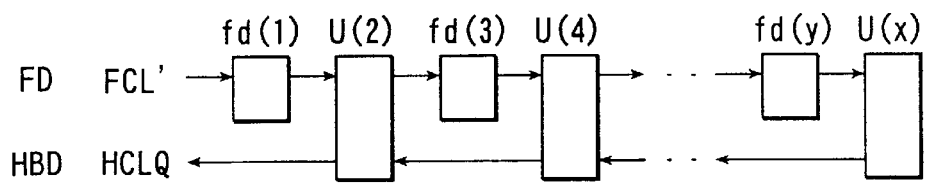
FIG. 6 is a block diagram of another synchronous adjustable delay circuit in one of FIGS. 2A to 2C.

FIG. 6 is a block diagram of the synchronous adjustable delay circuit 18 in FIG. 2B.

In FIG. 6, each of U(2) to U(x) (x=2n) is a delay unit composed of a pulse delay circuit fd(i), a state hold circuit sr(i), and a pulse delay circuit bd(i) as shown in FIG. 4.

In the case of the synchronous adjustable delay circuit 18 of FIG. 2B, the backward delay section BD in the synchronous adjustable delay circuit 14 of FIG. 2A is not needed, since a pulse delayed by the forward delay section FD need not be delayed by the backward delay section BD. It should be noted that the number of delay units U provided for the 1/2 forward delay section HFD is half compared to the number of delay units U provided for the configuration shown in FIG. 3. At the preceding stage of each delay unit U, a pulse delay circuit fd(i) (i=1 to y where y=2n-1) whose configuration is the same as that of the pulse delay circuit fd(i) of FIG. 4 is provided.

The synchronous adjustable delay circuit 18 depicted in FIG. 2C has such a configuration as is shown in FIG. 6.

With the clock control circuit constructed as described above, because the delay A of the delay circuit 13 in the circuit of FIG. 2A is set at 2(D1+D2), the period T of the external clock pulse CK is T=2(D1+D2)+$\Delta$.

The delay time of the internal clock pulse CKH from the external clock pulse CK is D1+$\Delta$/2+D2=(D1+D2)+$\Delta$/2=T/2. Thus, the internal clock pulse CKH is 180° (T/2) out of phase with the external clock CK.

The delay time of the internal clock pulse CK' from the external clock CK is D1+$\Delta$+D1+D2×2=2(D1+D2)+$\Delta$=T. Thus, the internal clock pulse CK' is in phase with the external clock pulse CK (or 360° (the period T) out of phase with the external clock CK).

Figure 7:
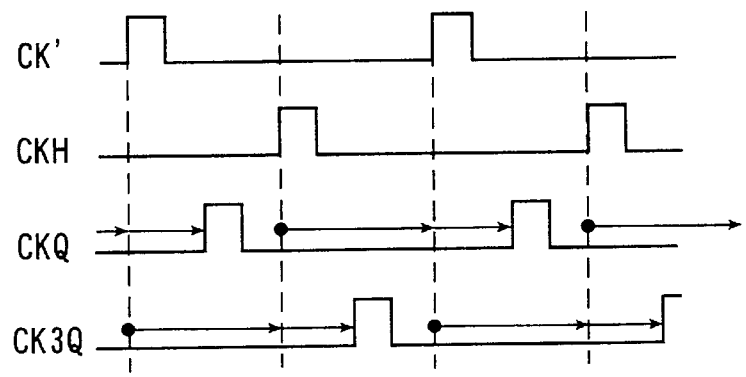
FIG. 7 is a timing chart to help explain the operation of the clock control circuit in FIGS. 2A to 2C.

In the circuit of FIG. 2B, the internal clock pulse CKH 180° out of phase with the internal clock CK' is inputted via the delay circuit 17 to the forward delay section FD of the synchronous adjustable delay circuit 18 and is delayed until the internal clock CK' in the next cycle rises. As a result, the delay time $\Delta$ at the forward delay section FD is equivalent to a phase difference of 180° between the internal clock pulse CKH and the internal clock CK' as shown in a timing chart of FIG. 7. In the 1/2 backward delay section HBD of the synchronous adjustable delay section 18, because the internal clock CK' is further delayed for a time equivalent to half the phase difference of 180°, the internal clock CKQ is 90° (T/4) out of phase with the internal clock CK'.

In this embodiment, because the internal clock pulse CKH is inputted via the delay circuit 17 with a delay of 2·D2 to the forward delay section FD of the synchronous adjustable delay circuit 18, the phase difference between the internal clock pulses CKH and CK' is actually 2·D2+$\Delta$. Because the delay circuit 19 delays the internal clock pulse HCLQ, the phase difference between the internal clock pulses CK' and CKQ is $\Delta$/2+D2, which is half the phase difference of 2·D2+$\Delta$ between the internal clock pulses CKH and CK'. As a result, the internal clock CKQ is 90° out of phase with the internal clock CK'.

In the circuit of FIG. 2C, the internal clock pulse CK' is inputted via the delay circuit 20 to the forward delay section FD of the synchronous adjustable delay circuit 21 and is delayed until the internal clock CKH in the next cycle rises. As a result, the delay time $\Delta$ at the forward delay section FD is equivalent to a phase difference of 180° between the internal clock pulse CK' and the internal clock CKH as shown in the timing chart of FIG. 7. In the 1/2 backward delay section HBD of the synchronous adjustable delay section 21, because the internal clock CKH is further delayed for a time equivalent to half the phase difference of 180°, the internal clock pulse CK3Q is 90° (T/4) out of phase with the internal clock CKH. That is, the internal clock pulse CK3Q is 270° (3T/4) out of phase with the internal clock CK'.

In the circuit of FIG. 2C, too, because the internal clock pulse CK' is supplied via the delay circuit 20 with a delay of 2·D2 to the forward delay section FD of the synchronous adjustable delay circuit 21, the phase difference between the internal clocks CK' and CKH is actually 2·D2+Δ. The delay circuit 22 delays the internal clock pulse HCL3Q. As a result, the phase difference between the internal clocks CKH and CK3Q is Δ/2+D2, which is half the phase difference of 2·D2+Δ between the internal clocks CK' and CKH. Consequently, the internal clock pulse CK3Q is 270° out of phase with the internal clock pulse CK'.

As described above, with the clock control circuit of the embodiment, the internal clock pulses CKQ, CK3Q 90° and 270° out of phase with the external clock pulse CK respectively can be generated.

Furthermore, because the delay of A of the delay circuit 13 in FIG. 2A is set at 2(D1+D2), the time allowance for the synchronous adjustable delay circuit 14 is improved remarkably than that in FIG. 1.

By way of explanation, let us consider a case where the frequency of the external clock pulse CK is 125 MHz and the cycle time is 8 ns. In this case, an external clock CK is input first, and while the internal clock CLK is being delayed by the delay circuit 13, the next external clock CK is input. When the internal clock CLK is output from the input buffer 12, the delay time Δ of the forward delay section FD becomes 0. Therefore, the delay time of the delay circuit 13 has to be determined to be shorter than the cycle time of the external clock CK, i.e., one period of the external clock CK. Hence, the delay time 2(D1+D2) of the delay circuit 13 has to be shorter than the cycle time 8 ns of the external clock CK, and the delay time corresponding to (D1+D2) may be 4 ns or less. The sum of the delay D1 of the input buffer 12 and the delay D2 corresponding to the driver delay of the internal clock can be easily reduced to 4 ns or less, in comparison with the case shown in FIG. 1, where it is reduced to 2 ns or less.

To achieve this, the clock control circuit of the embodiment is capable of generating internal clock pulses with various phase differences even from an external clock pulse with a very short cycle time.

Figure 8A:
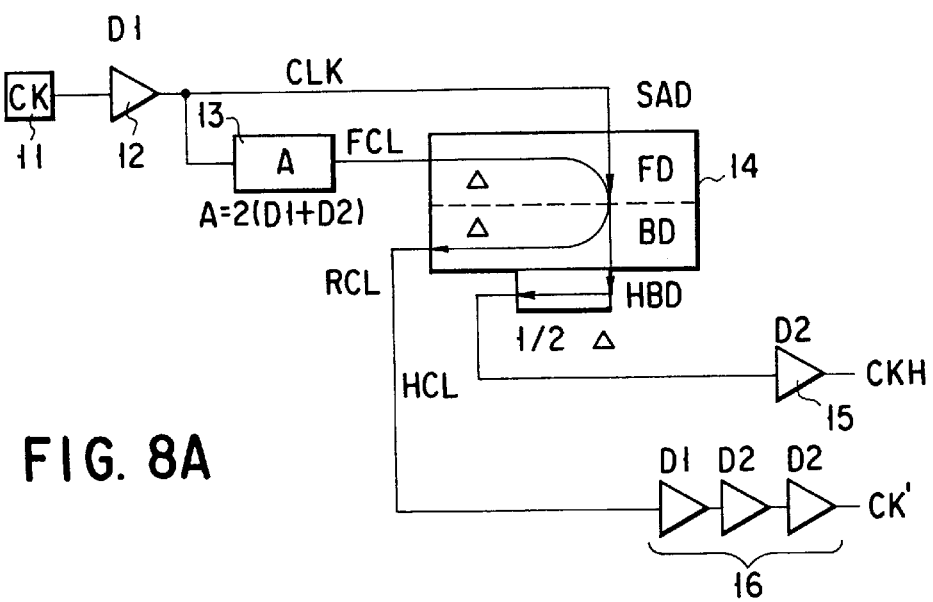
FIGS. 8A and 8B are circuit diagrams of a clock control circuit according to a second embodiment of the present invention.
Figure 8B:
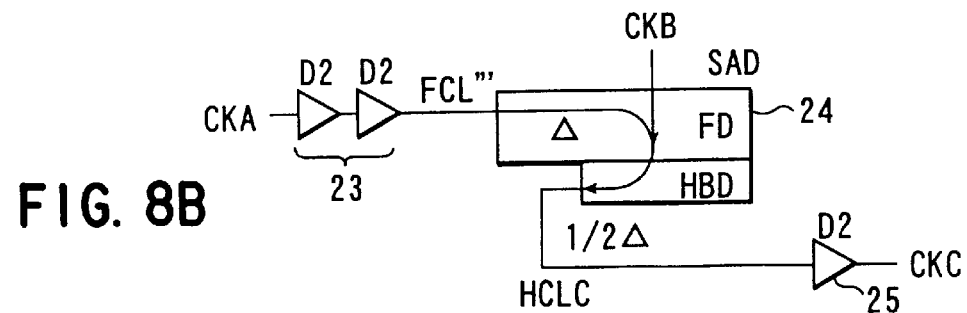

FIGS. 8A and 8B show the configuration of a clock control circuit according to a second embodiment of the present invention.

The clock control circuit shown in FIGS. 2A to 2C generates from the external clock CK two internal clock pulses CKQ, CK3Q 90° and 270° out of phase with the external clock pulse CK, respectively. The pulse control circuit of FIGS. 8A and 8B generalizes this and generates an internal clock pulse m·(1/2)$^n$ times 360° out of phase with the external clock CK.

The circuit of FIG. 8A is constructed in the same manner as the circuit of FIG. 2A. The circuit of FIG. 8B is constructed in the same manner as the circuit of FIG. 2B or FIG. 2C. Specifically, a clock pulse CKA equivalent to the internal clock pulse CKH or CK' is inputted to the clock control circuit of FIG. 8B. The clock control circuit of FIG. 8B comprises a delay circuit 23, a synchronous adjustable delay circuit 24, and a delay circuit 25. Like the delay circuit 17 or 20, the delay circuit 23 is composed of two drivers each with a delay of D2 using as clock drivers connected in series and has a delay of 2·D2 to an input clock pulse CKA. The synchronous adjustable delay circuit 24 includes a forward delay section FD and a 1/2 backward delay section HBD and is constructed as the synchronous adjustable delay circuit 18 or 21. Like the delay circuit 19 or 22, the output clock pulse HCLC from the 1/2 backward delay section HBD of the synchronous adjustable delay circuit 24 is supplied to the delay circuit 25. The delay circuit 25 is composed of a clock driver with a delay of D2. A clock pulse CKB serving as a control clock pulse corresponding to the internal clock pulse CK' or CKH is supplied to the synchronous adjustable delay circuit 24. The delay circuit 25 outputs a clock pulse CKC.

With the clock control circuit constructed as described above, internal clock pulses CKC with various phases can be generated, depending on what clocks are used as clocks CKA, CKB.

Figures 9, 10:
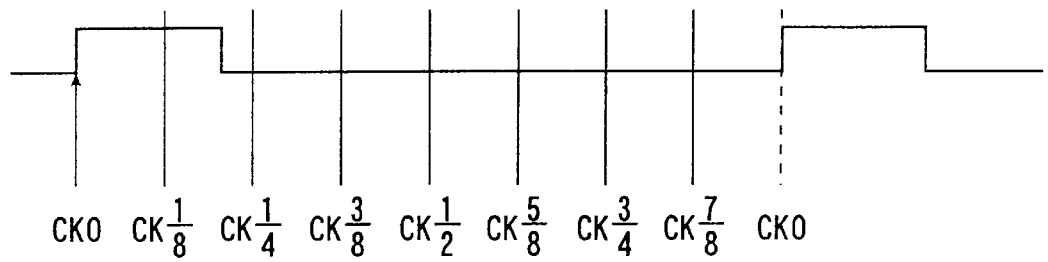
FIG. 9 shows internal clock pulses generated in the clock control circuit of FIGS. 8A and 8B.
FIG. 10 shows the relationship between clock pulses in the clock control circuit of FIGS. 8A and 8B.

Specifically, a case where an internal clock obtained by dividing 360° into eight equal parts as shown in FIG. 9 will be explained. In according with FIG. 9, the internal clocks to be generated will be referred to as CK0 (=CK'=CK1), CK1/8, CK1/4 (=CKQ=CK2/8), CK3/8, CK1/2 (=CKH=CK4/8), CK5/8, CK3/4 (=CK3Q=CK6/8), CK7/8 and CK0 (=CK8/8=CK').

At this time, a total of seven units of the circuit in FIG. 8B are needed. The relationship between clock pulses CKA, CKB, CKC and those clock pulses is as shown in FIG. 10.

As shown in FIG. 10, when classification is made according to an n number of levels (1, 2, 3), use of a clock pulse (CKC) produced at the preceding level enables clock pulses at an n number of levels to be produced. Therefore, the relationship between general clock pulses CKA, CKB, and CKc is derived, using m and n in CK(m/2)$^n$.

Figure 11:
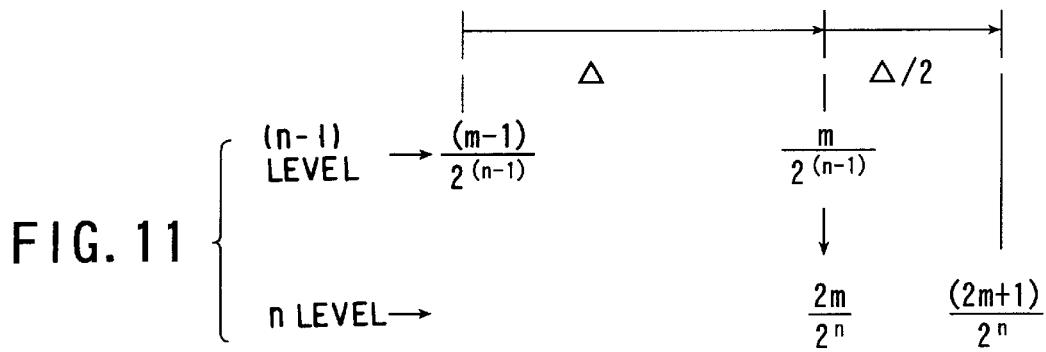
FIG. 11 shows the relationship between levels in the clock control circuit of FIGS. 8A and 8B.

FIG. 11 shows the relationship between levels. When CK(m-1)/2$^{n-1}$ is used as an input clock pulse and CKm/2$^{n-1}$ is used as an control clock pulse, an output clock pulse can be raised after half the delay Δ between the two clock pulses. Multiplying the denominator and numerator of the clock name m/2$^{n-1}$ at the (n-1) level by 2 gives the clock name at the n level. Adding 1 to the numerator of the clock gives the output clock name. Because the output clock pulse rises after the delay time equivalent to half the phase difference between the clocks used for input and control, the clock pulse at level n has a desired phase characteristic.

The definition of clock names is as shown in FIG. 11. Because m takes a value in the range from 0 to 2$^{n-1}$-1, if input clock pulse CKA=CK[i]/2$^{n-1}$, control clock CKB=CK[i+1]/2$^{n-1}$, output clock pulse CKC=CK{2[i+1]+1/2$^n$ (where 0≦[i]≦2$^{n-1}$-1 or [i]=i(mod2$^{n-1}$)), it is easy to generate an internal clock pulse {2[i+1]+1}/2$^n$ of 360° out of phase with the external clock.

The following is explanation of an application of the present invention.

Figure 12:
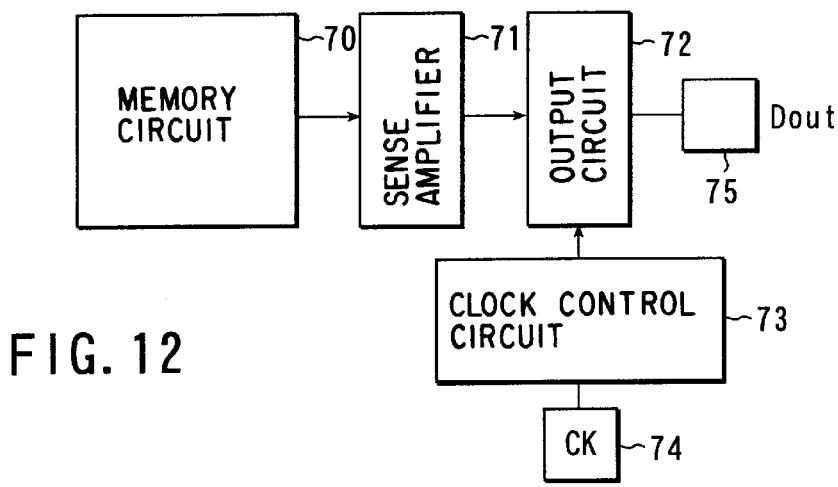
FIG. 12 is a schematic block diagram of a synchronous DRAM to which the present invention has been applied.

FIG. 12 is a schematic block diagram of a synchronous DRAM provided with a clock control circuit of the present invention. A memory circuit 70 includes a plurality of memory cells. In a data read operation, a row decoder and a column decoder (not shown) select a memory cell in the memory circuit 70. The stored data in the selected memory cell is sensed by a sense amplifier 71. The sensed data is supplied to an output circuit 72, which outputs the data as Dout at an output terminal 75.

Figure 13:
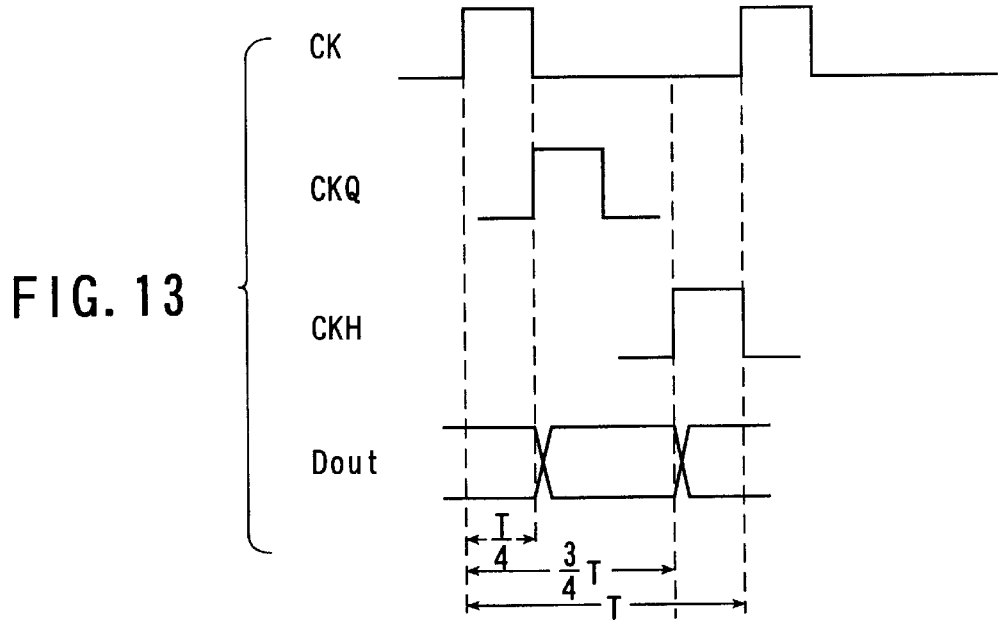
FIG. 13 is a timing chart to help explain the reading of data from the synchronous DRAM of FIG. 12.

In FIG. 12, numeral 73 indicates a clock control circuit having the circuit according to the first embodiment of FIGS. 2A and 2B or the circuits according to the second embodiment of FIGS. 8A and 8B. From an external clock pulse CK in a constant period of T supplied from a clock input terminal 74, the clock control circuit 73 generates a clock pulse CKQ 90° out of phase with the external clock pulse CK and a clock pulse CKH 270° out of phase with the external clock pulse CK. Then, the clock pulses CKQ, CKH outputted from the clock control circuit 73 are supplied to the output circuit 72. The output circuit 72 outputs the data sensed by the sense amplifier 71 as readout data Dout at the output terminal 75. As shown in a timing chart of FIG. 13, the output circuit 72 starts to output the readout data Dout with the timing that the internal clock pulse CKQ rises and ends the output of the readout data Dout with the timing that the internal clock CKH rises. Specifically, the data output period is set in the output circuit 72 on the basis of the timing of clock pulses CKQ and CKH. During the output period, the output circuit 72 outputs the readout data from the memory circuit 70.

Accordingly, the output period of the readout data Dout is a constant period from the time T/4 to the time 3T/4 after the external clock pulse CK has risen.

At the time of data write, write data Din (not shown) can be fetched during the period that is synchronous with the external clock CK (i.e., the constant period from the time T/4 to the time 3T/4).

In another application of the clock control circuit where the write data is sent to the memory in synchronization with the clock pulse, the clock control circuit may generate clock pulses with various phases and cause a write circuit to write the data using the generated clock pulses.

As described above, with the present invention, it is possible to provide a clock control circuit which operates properly even when the cycle time of an external clock is short.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal control circuit comprising:
   a first delay circuit which delays a first signal for a first time to produce a second signal;
   a delay measurement/signal delay circuit to which said second signal and a third signal having a phase different from that of said first signal are supplied, which measures a delay equivalent to the time from when the second signal was supplied until the third signal is supplied, and which delays the third signal from the time that the third signal was supplied for a time equivalent to half the measured delay to produce a fourth signal; and
   a second delay circuit which delays said fourth signal for a second time equivalent to half said first time to produce a fifth signal.

2. A signal control circuit according to claim 1, wherein said first delay circuit is composed of a receiver and said second delay circuit is composed of a driver.

3. A signal control circuit according to claim 1, wherein said delay measurement/signal delay circuit includes first signal delay circuits connected in series, said second signal being inputted to the first signal delay circuit at a first stage, and each first signal delay circuit delaying the output from the preceding stage for a specific delay and transferring it to the following stage;
   state hold circuits which receive the outputs from said first signal delay circuits and in which state hold units corresponding to the first delay unit in said first signal delay circuit to which said second signal has been transferred during the time from when said second signal was supplied until said third signal is supplied are each set to a first state; and
   second signal delay circuits connected in series which receive the hold states of said state hold circuits and are half as many as said first signal delay circuits, each of which has the same delay of said first signal delay circuits, and one of which receives said first state from said state hold circuit, delays said third signal to produce said fourth signal.

4. A clock control circuit comprising:
   a clock generator circuit which generates from a first clock pulse having a constant period a second clock pulse 180° out of phase with the first clock pulse and a third clock pulse in phase with the first clock pulse;
   a first delay circuit which delays said second clock pulse for a first time to produce a fourth clock pulse;
   a first delay measurement/signal delay circuit to which said fourth clock pulse and said third clock pulse are supplied, which measures a delay equivalent to the time from when the fourth clock pulse was supplied until the third clock pulse is supplied, and which delays the third clock pulse from the time that the third clock pulse was supplied for a time equivalent to half the measured delay to produce a fifth clock pulse; and
   a second delay circuit which delays said fifth clock pulse for a second time equivalent to half said first time to produce a sixth clock pulse 90° out of phase with said third clock pulse.

5. A clock control circuit according to claim 4, wherein said first delay circuit is composed of a receiver and said second delay circuit is composed of a driver.

6. A clock control circuit according to claim 4, further comprising:
   a third delay circuit which delays said third clock pulse for a first time to produce a seventh clock pulse;
   a second delay measurement/signal delay circuit to which said seventh clock pulse and said second clock pulse are supplied, which measures a delay equivalent to the time from when the seventh clock pulse was supplied until the second clock pulse is supplied, and which delays the second clock pulse from the time that the second clock pulse was supplied for a time equivalent to half the measured delay to produce an eighth clock pulse; and
   a fourth delay circuit which delays said eighth clock pulse for a second time to produce a ninth clock pulse 270° out of phase with said third clock pulse.

7. A clock control circuit according to claim 6, wherein said third delay circuit is composed of a receiver and said fourth delay circuit is composed of a driver.

8. A clock control circuit according to claim 6, wherein said second delay measurement/signal delay circuit includes third signal delay circuits connected in series, said seventh clock pulse being inputted to the third signal delay circuit at a first stage, and each third signal delay circuit delaying the output from the preceding stage for a specific delay and transferring it to the following stage;

state hold circuits which receive the outputs from said third signal delay circuits and which corresponding to said third signal delay circuits to which said seventh clock pulse has been transferred during the time from when said seventh clock pulse was supplied until said second clock pulse is supplied are each set to a first state; and fourth signal delay circuits connected in series which receive the hold states of said state hold circuits and are half as many as said third signal delay circuits, each of which has the same delay of said third signal delay circuits, and one of which receives said first state from said state hold circuit, delays said second clock pulse to produce said eighth clock pulse.

9. A clock control circuit according to claim 4, wherein said clock generator circuit includes a fifth delay circuit with a delay of D1 which delays said first clock pulse to produce a tenth clock pulse;

a sixth delay circuit with a delay of 2(D1+D2) which delays said tenth clock pulse to produce an eleventh clock pulse;

a third delay measurement/signal delay circuit to which said eleventh clock pulse and said tenth clock pulse are supplied, which measures a delay equivalent to the time from when the eleventh clock pulse was supplied until the tenth clock pulse is supplied, and which delays not only the tenth clock pulse from the time that the tenth clock pulse was supplied for a time equivalent to the measured delay to produce a twelfth clock pulse but also the tenth clock pulse from the time that the tenth clock pulse was supplied for a time equivalent to half the measured delay to produce a thirteenth clock pulse;

a seventh delay circuit with a delay of D1+2D2 which delays said twelfth clock pulse to produce said third pulse; and an eighth delay circuit with a delay of D2 which delays said thirteenth clock pulse to produce said second clock pulse.

10. A clock control circuit according to claim 9, wherein said fifth delay circuit is composed of a receiver and said seventh and eighth delay circuits are composed of drivers.

11. A clock control circuit according to claim 9, wherein said third delay measurement/signal delay circuit includes fifth signal delay circuits connected in series, said eleventh clock pulse being inputted to the fifth signal delay circuit at a first stage, and each fifth signal delay circuit delaying the output from the preceding stage for a specific delay and transferring it to the following stage;

state hold circuits which receive the outputs from said fifth signal delay circuits and which corresponding to said fifth signal delay circuits to which said eleventh clock pulse has been transferred during the time from when said eleventh clock pulse was supplied until said tenth clock pulse is supplied are each set to a first state;

sixth signal delay circuits connected in series which receive the hold states of said state hold circuits and are as many as said fifth signal delay circuits, each of which has the same delay of said fifth signal delay circuits, and one of which receives said first state from said state hold circuit, delays said tenth clock pulse to produce said twelfth clock pulse; and seventh signal delay circuits connected in series which receive the hold states of said state hold circuits and are half as many as said fifth signal delay circuits, each of which has the same delay of said fifth signal delay circuits, and one of which receives said first state from said state hold circuit, delays said tenth clock pulse to produce said thirteenth clock pulse.

12. A clock control circuit according to claim 4, wherein said first delay measurement/signal delay circuit includes first signal delay circuits connected in series, said fourth clock pulse being inputted to the first signal delay circuit at a first stage, and each first signal delay circuit delaying the output from the preceding stage for a specific delay and transferring it to the following stage;

state hold circuits which receive the outputs from said first signal delay circuits and which corresponding to said first signal delay circuits to which said fourth clock pulse has been transferred during the time from when said fourth clock pulse was supplied until said third clock pulse is supplied are each set to a first state;

second signal delay circuits connected in series which receive the hold states of said state hold circuits and are half as many as said first signal delay circuits, each of which has the same delay of said first signal delay circuits, and one of which receives said first state from said state hold circuit, delays said third clock pulse to produce said fifth clock pulse.

13. A clock control circuit comprising:

a first clock pulse generating circuit for generating a second clock pulse $360° \times [i]/2^{(n-1)}$ (where $[i]=i(\mod 2^{(n-1)})$, i is a positive integer including 0, and n is a positive integer excluding 0) out of phase with respect to a first clock pulse having a constant cycle;

a second clock pulse generation circuit for generating a third clock pulse $360° \times [i+1]/2^{(n-1)}$ out of phase with respect to that of the first clock pulse;

a delay measurement circuit to which said second clock pulse generated by said first clock pulse generation circuit and said third clock pulse generated from said second clock pulse generation circuit are input, and which measures a delay equivalent to half the time from when said second clock pulse was supplied until said third clock pulse is supplied; and a clock output circuit which delays said third clock pulse for a time equivalent to said measured delay from the time that said third clock was supplied to produce a fourth clock pulse $360° \times m/2^n ((m=2[i+1]+1)$, and m is an integer of odd number in a range of 0 to $2^{(n-1)}-1$) out of phase with the first clock pulse.

14. A semiconductor memory device comprising:

a memory circuit with a plurality of memory cells;

a clock control circuit to which a first clock pulse is inputted and which outputs a second and a third clock pulse each out of phase with the first clock pulse; and an output circuit which receives not only a readout data from said memory circuit but also said second and third clock pulses in reading the data, sets a data output period on the basis of the timing of said second and third clock pulses, and outputs the readout data from said memory circuit during the output period, wherein said clock control circuit includes a clock generator circuit which generates from said first clock pulse a second clock 180° out of phase with the first clock pulse and a fourth clock pulse in phase with the first clock pulse;

a first delay circuit which delays said second clock pulse for a first time to produce a fifth clock pulse;

a first delay measurement/signal delay circuit to which said fifth clock pulse and said fourth clock pulse are supplied, which measures a delay equivalent to the time from when the fifth clock pulse was supplied until the fourth clock pulse is supplied, and which delays the fourth clock pulse from the time that the fourth clock pulse was supplied for a time equivalent to half the measured delay to produce a sixth clock pulse; and a second delay circuit which delays said sixth clock pulse for a second time equivalent to half said first time to produce said third clock pulse 90° out of phase with said fourth clock pulse.

15. A semiconductor memory device according to claim 14, wherein said clock generator circuit includes a third delay circuit with a delay of D1 which delays said first clock pulse to produce a seventh clock pulse;

a fourth delay circuit with a delay of 2(D1+D2) which delays said seventh clock pulse to produce an eighth clock pulse;

a second delay measurement/signal delay circuit to which said eighth clock pulse and said seventh clock pulse are supplied, which measures a delay equivalent to the time from when the eighth clock pulse was supplied until the seventh clock pulse is supplied, and which delays not only the seventh clock pulse from the time that the seventh clock pulse was supplied for a time equivalent to the measured delay to produce a ninth clock pulse but also the seventh clock pulse from the time that the seventh clock pulse was supplied for a time equivalent to half the measured delay to produce a tenth clock pulse;

a fifth delay circuit with a delay of D1+2D2 which delays said ninth clock pulse to produce said fourth pulse; and a sixth delay circuit with a delay of D2 which delays said tenth clock pulse to produce said second clock pulse.

* * * * *